United States Patent
Osada et al.

(12) 
(10) Patent No.: US 6,291,556 B1
(45) Date of Patent: Sep. 18, 2001

(54) SEMICONDUCTOR ENCAPSULATING EPOXY RESIN COMPOSITION AND SEMICONDUCTOR DEVICE

(75) Inventors: Shoichi Osada; Eiichi Asano; Shigeki Ino; Takayuki Aoki; Kazutoshi Tomiyoshi; Toshio Shiobara, all of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/534,386

(22) Filed: Mar. 24, 2000

(30) Foreign Application Priority Data

Mar. 26, 1999 (JP) .................................. 11-083656

(51) Int. Cl.⁷ .................................. C08K 63/00
(52) U.S. Cl. .................. 523/451; 523/210; 524/406; 524/414; 524/432
(58) Field of Search .................. 523/200, 201, 523/210, 211, 451

(56) References Cited

U.S. PATENT DOCUMENTS

| | | |
|---|---|---|
| 2,766,139 | 10/1956 | Green et al. . |
| 3,373,135 | 3/1968 | Jenkner et al. . |
| 3,398,019 | 8/1968 | Langguth et al. . |
| 4,273,691 | 6/1981 | MacLaury et al. . |
| 4,632,946 | 12/1986 | Muench et al. . |
| 4,902,732 | 2/1990 | Itoh et al. . |
| 5,338,347 * | 8/1994 | Rohr et al. .................. 106/14.44 |
| 5,360,837 | 11/1994 | Honda et al. . |
| 5,434,199 | 7/1995 | Gallagher et al. . |
| 5,476,884 | 12/1995 | Kayaba et al. . |
| 5,567,749 | 10/1996 | Sawamura et al. . |
| 5,739,186 | 4/1998 | Hayakawa et al. . |
| 5,994,429 * | 11/1999 | Honda et al. .................. 523/451 |

FOREIGN PATENT DOCUMENTS

| | | |
|---|---|---|
| 1110789 | 10/1981 | (CA) . |
| A20272482 | 6/1988 | (EP) . |
| 1104606 | 2/1968 | (GB) . |
| A63- 95249 | 4/1988 | (JP) . |
| A63-101454 | 5/1988 | (JP) . |
| A63-117057 | 5/1988 | (JP) . |
| A63-275661 | 11/1988 | (JP) . |
| A63-312349 | 12/1988 | (JP) . |
| 08239449 * | 9/1996 | (JP) . |
| 111323088 * | 11/1999 | (JP) . |

* cited by examiner

Primary Examiner—Edward J. Cain
Assistant Examiner—Katarzyna W. Lee
(74) Attorney, Agent, or Firm—Birch, Stewart, Kolasch & Birch, LLP

(57) ABSTRACT

A semiconductor encapsulating epoxy resin composition is provided comprising (A) an epoxy resin, (B) a phenolic resin curing agent, (C) a microencapsulated flame retardant comprising a red phosphorus-base core coated with a thermoplastic resin and/or thermosetting resin, (D) a molybdenum compound, and (E) an inorganic filler. The composition and its cured product have moisture-proof reliability and high flame retardance despite the absence of halogenated epoxy resins and antimony oxide.

10 Claims, No Drawings

SEMICONDUCTOR ENCAPSULATING EPOXY RESIN COMPOSITION AND SEMICONDUCTOR DEVICE

This invention relates to an epoxy resin composition for semiconductor encapsulation which cures into a product having flame retardance and moisture-proof reliability. It also relates to a semiconductor device encapsulated with a cured product of the composition.

BACKGROUND OF THE INVENTION

The current mainstream in the semiconductor industry resides in diodes, transistors, ICs, LSIs and VLSIs of the resin encapsulation type. Epoxy resins have superior moldability, adhesion, electrical properties, mechanical properties, and moisture resistance to other thermosetting resins. It is thus a common practice to encapsulate semiconductor devices with epoxy resin compositions. Semiconductor devices are now used in every area of the modern society, for example, in electric appliances and computers. As a guard against accidental fire, the semiconductor encapsulating materials are required to be flame retardant.

Halogenated epoxy resins combined with antimony trioxide are often blended in epoxy resin compositions in order to enhance flame retardance. This combination of a halogenated epoxy resin with antimony trioxide has great radical-trapping and air-shielding effects in the vapor phase, thus conferring a high fire-retarding effect. However, halogenated epoxy resins generate noxious gases during combustion, and antimony trioxide has powder toxicity. Given their negative impact on human health and the environment, it is desirable to entirely exclude these fire retardants from resin compositions.

In view of the above demand, studies have been conducted on the use of hydroxides such as $Al(OH)_3$ and $Mg(OH)_2$ or phosphorus-containing fire retardants in place of halogenated epoxy resins and antimony trioxide. Unfortunately, because of various problems associated with the use of these alternative compounds, such as inferior curability of the resin composition during molding and poor moisture resistance in the cured product, they are not yet ready for practical application.

Of the phosphorus-containing fire retardants, red phosphorus is effective for imparting a very high flame retardance to the composition since it forms a phosphoric acid compound during combustion, which bonds with a char layer to form a flame retardant film. However, red phosphorus needs careful handling because of inferior compound stability and an ignition danger upon impact. Additionally, red phosphorus has a serious drawback that if it is added to semiconductor encapsulating epoxy resin compositions, it gradually forms a phosphoric acid compound which can corrode aluminum wiring in semiconductor devices, resulting in a loss of reliability. Red phosphorus is thus inapplicable to semiconductor encapsulating epoxy resin compositions.

SUMMARY OF THE INVENTION

An object of the invention is to provide an epoxy resin composition for semiconductor encapsulation which is free of harmful halogenated epoxy resins and antimony oxide, is effectively moldable and cures into a product having a very high flame retardance and moisture-proof reliability. Another object is to provide a semiconductor device encapsulated with a cured product of the composition.

The invention provides a semiconductor encapsulating epoxy resin composition comprising (A) an epoxy resin, (B) a phenolic resin curing agent, (C) a first flame retardant in the form of microcapsules comprising a red phosphorus-base core covered with a thermoplastic resin and/or thermosetting resin, (D) a second flame retardant in the form of a molybdenum compound, and (E) an inorganic filler. This composition or its cured product has good moldability, moisture-proof reliability, and high flame retardance despite the absence of halogenated epoxy resins and antimony oxide.

DETAILED DESCRIPTION OF THE INVENTION

Component (A) is an epoxy resin which is not critical as long as it has at least two epoxy groups per molecule. Illustrative examples of suitable epoxy resins include novolac-type epoxy resins such as phenolic novolac epoxy resins and cresol novolac epoxy resins, triphenolalkane epoxy resins, aralkyl epoxy resins, biphenyl skeleton-containing aralkyl epoxy resins, biphenyl epoxy resins, heterocyclic epoxy resins, naphthalene ring-containing epoxy resins, bisphenol-type epoxy resins such as bisphenol A epoxy compounds and bisphenol F epoxy compounds, and stilbene epoxy resins. Any one or combination of two or more of these epoxy resins may be employed. Halogenated epoxy resins are excluded.

No particular limit is imposed on the phenolic resin serving as curing agent (B) so long as it has at least two phenolic hydroxy groups in a molecule in the invention. Illustrative examples of typical phenolic resin curing agents include novolac-type phenolic resins such as phenolic novolac resins and cresol novolac resins, naphthalene ring-containing phenolic resins, triphenolalkane phenolic resins, phenolaralkyl phenolic resins, aralkyl phenolic resins, biphenyl skeleton-containing aralkyl phenolic resins, biphenyl phenolic resins, alicyclic phenolic resins, heterocyclic phenolic resins, and bisphenol-type phenolic resins such as bisphenol A and bisphenol F. Any one or combination of two or more of these phenolic resins may be employed.

The relative proportions of the epoxy resin (A) and the phenolic resin curing agent (B) used in the epoxy resin compositions are not subject to any particular limits, although it is preferred that the amount of phenolic hydroxyl groups in the curing agent (B) be from 0.5 to 1.5 moles, and especially 0.8 to 1.2 moles, per mole of epoxy groups in the epoxy resin (A).

The semiconductor encapsulating epoxy resin compositions of the invention do not contain conventional flame retardants such as antimony trioxide and brominated or otherwise halogenated epoxy resins. Instead, the inventive compositions use as the flame retardant (C) microcapsules comprising a red phosphorus-base core coated with a thermoplastic resin and/or thermosetting resin and (D) a molybdenum compound, typically zinc molybdate, and especially zinc molybdate supported on an inorganic carrier.

The core of the microcapsules as component (C) is made of a material based on red phosphorus and having optional processing aids added thereto. It is not necessary to add other ingredients, that is, the core material consisting of red phosphorus is acceptable. The core is coated with a resin which may be either thermoplastic or thermosetting. Suitable examples include poly(meth)acrylic acid ester resins such as poly(methyl methacrylate) and poly(methyl acrylate), polystyrene, polybutadiene, methyl methacrylate-butadiene-styrene copolymers, silicone resin, epoxy resins, and phenolic resins.

In component (C), the cores based on red phosphorus are coated with a thermoplastic resin and/or thermosetting resin by a conventional method, obtaining microcapsules. Microencapsulation has several advantages. Although red phosphorus can be decomposed into a phosphoric acid compound, the microcapsules prevent the phosphoric acid compound from directly corroding aluminum wiring. Only when the resin covering the core material is thermally decomposed, the phosphoric acid compound can bond with a char layer to form a flame retardant film. Moreover, microencapsulation of the core material not only improves the dispersion thereof in the epoxy resin (A) and the phenolic resin curing agent (B) for enhancing flame retardance, but also reduces the ignition upon impact and thus ensures ease of handling.

In the microcapsules as component (C), the content of red phosphorus as the core is preferably 60 to 99.5%, and especially 80 to 99% by weight. The microcapsule particles preferably have a mean particle size of about 0.1 to 100 μm, more preferably about 0.2 to 40 μm, especially about 0.5 to 20μm from the viewpoint of flame retardancy, dispersibility and workability (low viscosity of the composition). Such microencapsulated red phosphorus is commercially available under the trade name of Nova-Excel series such as Nova-Excel 140 from Rin Kagaku Kogyo K.K.

Component (C) is preferably blended in amounts of 0.5 to 3 parts by weight per 100 parts by weight of a mixture of the epoxy resin (A) and the phenolic resin curing agent (B), the mixture being labeled (F), hereinafter. Less amounts of component (C) may fail to achieve a satisfactory flame retardant effect whereas excessive amounts of component (C) may cause molding defects such as internal and external voids and lower moisture resistance.

In component (C), surfaces of red phosphorus particulates are coated with the resin. However, under rigorous conditions as encountered in a pressure cooker, the microcapsules permit red phosphorus to leach and dissolve out to adversely affect the moisture resistance of semiconductor devices. To achieve both high flame retardance and moisture resistance by eliminating such a deleterious effect, the invention employs component (D) along with component (C).

The epoxy resin composition of the invention contains a molybdenum compound as the second flame retardant (D). Exemplary molybdenum compounds are molybdenum (IV) oxide and molybdic acid salts such as zinc molybdate, calcium molybdate carbonate, and calcium molybdate. Of these, zinc molybdate is especially preferred since it does not affect the curability of the epoxy resin. The molybdenum compound, typically zinc molybdate, by itself is known to have a smoke-reducing and charring effect in burning plastic, but it exists in the form of very fine particles and so cannot easily be dispersed in a resin composition. To improve the dispersion of the molybdenum compound to enhance the flame retardant effect, the molybdenum compound is preferably supported on an inorganic carrier. Suitable inorganic carriers include silicas such as spherical or pulverized fused silica and crystalline silica, talc, alumina, silicon nitride, aluminum nitride, boron nitride, titanium oxide, and glass fibers. Of these, talc and spherical silica are preferred because of good dispersion in the epoxy resin compositions. The inorganic carrier should preferably have a mean particle diameter of 0.1 to 40 μm, and more preferably 0.5 to 15 μm and a specific surface area of 0.5 to 50 m$^2$/g, and more preferably 0.7 to 10 m$^2$/g.

It is noted that the mean particle diameter can be determined as the weight average value (or median diameter) based on the laser light diffraction technique, for example.

In the second flame retardant comprising zinc molybdate supported on the inorganic carrier, the content of zinc molybdate is preferably 5 to 40% by weight, more preferably 10 to 20% by weight. Less contents of zinc molybdate may fail to provide satisfactory flame retardance whereas excessive contents may detract from flow during molding and curability.

The zinc molybdate on inorganic carrier is commercially available under the trade name of KEMGARD series, such as KEMGARD 1260, 1261, 1270, 1271 and 911C from Sherwin-Williams Co.

An appropriate amount of component (D) blended is 3 to 100 parts by weight per 100 parts by weight of the mixture (F) of the epoxy resin (A) and the phenolic resin curing agent (B). Less amounts of component (D) may fail to provide satisfactory flame retardance whereas excessive amounts may detract from the flow and curability of the composition.

As described above, by blending relatively small amounts of the first flame retardant (C) in the form of microcapsules of red phosphorus base core material coated with a thermoplastic and/or thermosetting resin and the second flame retardant (D) in the form of a molybdenum compound, especially zinc molybdate on an inorganic carrier, the invention achieves a higher degree of flame retardance while maintaining moisture resistance. It has been found that an attempt to improve both the flame retardance and moisture resistance by using components (C) and (D) in as small amounts as possible depends largely on the value of specific peaks on $^1$H-NMR analysis of the mixture (F) of the epoxy resin (A) and the phenolic resin curing agent (B).

More particularly, a proton-NMR analysis of the mixture (F) gives a proton-NMR spectrum where proton peaks appear. When the value of (integrated value of proton peaks appearing at 1 to 5 ppm)/(integrated value of proton peaks appearing at 6 to 8 ppm) is less than 2.0, the benefits of the invention are achieved by adding 0.5 to 2 parts by weight of the first flame retardant (C) and 3 to 100 parts by weight of the second flame retardant (D) per 100 parts by weight of the mixture (F). Similarly, when the value of (integrated value of proton peaks appearing at 1 to 5 ppm)/(integrated value of proton peaks appearing at 6 to 8 ppm) is at least 2.0, the benefits of the invention are achieved by adding 1 to 5 parts by weight of the first flame retardant (C) and 10 to 100 parts by weight of the second flame retardant (D) per 100 parts by weight of the mixture (F). The proton peaks appearing at 1 to 5 ppm are mainly due to aliphatic protons in the epoxy resin and phenolic resin, and the proton peaks appearing at 6 to 8 ppm are mainly due to aromatic protons in the epoxy resin and phenolic resin. It is believed that a resin containing less aliphatic carbon, but more aromatic carbon is more heat resistant and flame retardant, enabling to minimize the amount of the flame retardant added. It is noted that a resin component such as an epoxy-modified silicone resin may be added as a base resin in addition to the epoxy resin (A) and the phenolic resin curing agent (B) insofar as the benefits of the invention are not impaired. In such an embodiment, the mixture (F) is a mixture of all the essential and optional base resins.

The inorganic filler (E) included in the epoxy resin compositions of the invention may be any suitable inorganic filler commonly used in epoxy resin compositions other than components (C) and (D). The inorganic filler (E) preferably has a mean particle size of about 0.5 to 40 μm, more preferably about 1 to 25 μm. Illustrative examples include silicas such as fused silica and crystalline silica, alumina, silicon nitride, aluminum nitride, boron nitride, titanium oxide, and glass fibers. No particular limit is imposed on the mean particle diameter and shape of these inorganic fillers, although the use of spherical fused silica having a mean particle diameter of 5 to 40 μm is preferred because it endows the epoxy resin composition with good molding and flow characteristics.

The inventive epoxy resin compositions have inorganic filler (E) loadings of preferably 300 to 1,000 parts by weight, and more preferably 500 to 900 parts by weight per 100 parts by weight of the mixture (F) of the epoxy resin (A) and the phenolic resin curing agent (B). At less than 300 parts by weight, the epoxy resin composition would have a large coefficient of expansion, resulting in greater stress on the semiconductor device and a decline in the device characteristics. Moreover, the proportion of resin relative to the overall composition becomes larger, sometimes failing to attain the fire retardance that is the object of this invention. On the other hand, more than 1,000 parts by weight of the inorganic filler would result in an excessive rise in viscosity during molding and thus impede molding. The content of inorganic filler within the epoxy resin composition (excluding the flame retardants (C) and (D)) is preferably 70 to 92% by weight, and especially 80 to 90% by weight.

The inorganic filler used herein is preferably surface treated beforehand with a coupling agent such as a silane coupling agent or a titanate coupling agent in order to increase the bonding strength between the resin and the inorganic filler. Preferred examples of such coupling agents include epoxy group-bearing alkoxysilanes such as γ-glycidoxypropyltrimethoxysilane, γ-glycidoxypropylmethyl-diethoxysilane, and β-(3,4-epoxycyclohexyl)ethyltrimethoxy-silane; amino group-bearing alkoxysilanes such as N-β-(aminoethyl)-γ-aminopropyltrimethoxysilane, γ-aminopropyl-triethoxysilane, and N-phenyl-γ-aminopropyltrimethoxysilane; and mercapto group-bearing alkoxysilanes such as γ-mercaptopropyltrimethoxysilane and γ-mercaptopropyl-methyldimethoxysilane. No particular limitation is imposed on the amount of coupling agent used for surface treatment or the method of surface treatment.

In the practice of this invention, use is preferably made of a curing accelerator to promote the curing reaction between the epoxy resin and the curing agent. The curing accelerator may be any suitable substance that promotes the curing reaction. Illustrative, non-limiting examples of curing accelerators that may be used include organo-phosphorus compounds such as triphenylphosphine, tributyl-phosphine, tri(p-methylphenyl)phosphine, tri(nonylphenyl)-phosphine, triphenylphosphine triphenylborane, and tetraphenylphosphine tetraphenylborate; tertiary amine compounds such as triethylamine, benzyldimethylamine, α-methylbenzyldimethylamine, and 1,8-diazabicyclo [5.4.0]-undecene-7; and imidazole compounds such as 2-methyl-imidazole, 2-phenylimidazole, and 2-phenyl-4-methyl-imidazole.

The semiconductor encapsulating epoxy resin compositions of the invention may also include various additives, if necessary. Illustrative examples include stress-lowering additives such as thermoplastic resins, thermoplastic elastomers, synthetic organic rubbers, and silicones; waxes such as carnauba wax, higher fatty acids, and synthetic waxes; colorants such as carbon black; and halogen trapping agents.

The inventive epoxy resin compositions may be prepared by compounding the epoxy resin, curing agent, inorganic filler, and other components in predetermined proportions, thoroughly mixing these components together in a mixer or other appropriate apparatus, then melting and working the resulting mixture using hot rolls, a kneader, an extruder or the like. The worked mixture is then cooled and solidified, and subsequently milled to a suitable size so as to give a molding material.

The resulting epoxy resin compositions of the invention can be effectively used for encapsulating various types of semiconductor devices. The method of encapsulation most commonly used is low-pressure transfer molding. The epoxy resin composition of the invention is preferably molded at a temperature of about 150 to 180° C. for a period of about 30 to 180 seconds, followed by postcuring at about 150 to 180° C. for about 2 to 16 hours.

The semiconductor encapsulating epoxy resin compositions of the invention cure into products which have an excellent fire retardance and moisture resistance. Owing to the absence of halogenated epoxy resins and antimony trioxide, the epoxy resin compositions have no adverse impact on human health or the environment.

EXAMPLE

Examples of the invention and comparative examples are given below by way of illustration, and are not intended to limit the invention. All parts are by weight.

Examples 1–10 and Comparative Examples 1–4

Base resin mixtures were prepared by uniformly melt mixing an epoxy resin (ingredients (a) to (d)), a curing agent (ingredients (e) and (f)), and an epoxy-modified silicone rubber in proportions as shown in Tables 1 and 2, followed by cooling. These base resin mixtures were analyzed by proton-NMR. Values of (integrated value of proton peaks appearing at 1 to 5 ppm)/(integrated value of proton peaks appearing at 6 to 8 ppm) are shown in Tables 1 and 2.

Next, the remaining ingredients shown in Tables 1 and 2 were added to each of the base resin mixtures, which was uniformly melt mixed in a hot twin-roll mill, cooled and comminuted, obtaining an epoxy resin composition which was ready for semiconductor encapsulation. The ingredients used are shown below.

Epoxy Resins:
(a) o-cresol novolac epoxy resin: EOCN1020-55 by Nippon Kayaku K.K. (epoxy equivalent 200)
(b) biphenyl epoxy resin: YX4000HK by Yuka Shell K.K. (epoxy equivalent 190)
(c) triphenolalkane epoxy resin: TNH574 by Sumitomo Chemical K.K. (epoxy equivalent 220)
(d) dicyclopentadiene epoxy resin: HP7200 by Dai-Nippon Ink and Chemicals K.K. (epoxy equivalent 258)

Curing Agents:
(e) phenolic novolac resin: DL-92 by Meiwa Kasei K.K. (phenolic equivalent 110)
(f) phenolic aralkyl resin: MEH-7800SS by Meiwa Kasei K.K. (phenolic equivalent 175)

Microencapsulated Red Phosphorus:
Nova-Excel 140 (coated with phenolic resin) by Rin Kagaku Kogyo K.K.

Zinc molybdate on inorganic carrier:
KEMGARD 1261 (carrier: spherical silica with a mean particle size 0.5 μm and a specific surface area 5.5 $m^2$/g) by Sherwin-Williams Co.
KEMGARD 911C (carrier: talc with a mean particle size 2.0 μm and a specific surface area 2.0 $m^2$/g) by Sherwin-Williams Co.

Inorganic Fillers:
Spherical fused silica (mean particle size 20 μm) by Tatsumori K.K.
Crystalline silica: Crystallite 3K by Tatsumori K.K.

Epoxy-modified silicone resin (siloxane content 16 wt %)

Curing Accelerator:
triphenyl phosphine by Hokko Chemical K.K.

Parting Agent:
Carnauba wax by Nikko Fine Products K.K. Silane coupling agent:
KBM403 (γ-glycidoxypropyltrimethoxysilane) by Shin-Etsu Chemical Co., Ltd.

These compositions were measured for the following properties. The results are given in Tables 3 and 4.

(1) Spiral Flow:
Measured by molding at 175° C. and 70 kgf/cm² for a molding time of 90 seconds using a mold in accordance with EMMI standards.

(2) Hardness When Molded:
Using the method described in JIS-K6911, a rod measuring 10×4×100 mm was molded at 175° C. and 70 kgf/cm² for a time of 90 seconds. The hardness when hot was measured with a Barcol Impressor.

(3) Moldability
A QFP package of 14×21×3.5 mm was molded. Using an ultrasonic flaw detector, internal voids were detected.

(4) Flame Retardance:
A 1/16 inch thick sheet was molded and the flame retardance of the sheet was rated in accordance with UL-94 test specifications.

(5) Moisture Resistance:
A silicon chip measuring 1×1 mm on which aluminum wiring had been formed was adhesively bonded to a 14-pin dual in-line package (DIP) frame (Alloy 42), and the aluminum electrodes on the chip surface were wire bonded to the lead frame using 30 μm gold wire. The epoxy resin composition was then molded over the chip at 175° C. and 70 kg/cm² for a time of 120 seconds, and post-cured at 180° C. for 4 hours. Twenty packages thus obtained were left to stand for 500 hours at 140° C. and 85% relative humidity while being subjected to a bias voltage of 5V DC. The number of packages in which aluminum corrosion arose was counted.

TABLE 2

| Ingredients (parts by weight) | | Comparative Example | | | |
|---|---|---|---|---|---|
| | | 1 | 2 | 3 | 4 |
| Epoxy resin (a) | | 52.7 | 52.7 | 52.7 | 46.5 |
| Epoxy resin (b) | | — | — | — | — |
| Epoxy resin (c) | | — | — | — | — |
| Epoxy resin (d) | | — | — | — | — |
| Curing agent (e) | | 34.8 | 34.8 | 34.8 | 34.8 |
| Curing agent (f) | | — | — | — | — |
| Epoxy-modified silicone resin | | 12.5 | 12.5 | 12.5 | 12.5 |
| Inorganic filler | Spherical silica | 500 | 500 | 500 | 500 |
| | Crystalline silica | — | — | — | — |
| Curing accelerator | | 1.2 | 1.2 | 1.2 | 1.2 |
| KEMGARD 1261 | | — | — | 100 | — |
| KEMGARD 911C | | — | — | — | — |
| Nova-Excel 140 | | — | 5 | — | — |
| Antimony trioxide | | — | — | — | 4 |
| Brominated novolak epoxy resin | | — | — | — | 6.2 |
| Parting agent | | 3 | 3 | 3 | 3 |
| Carbon black | | 2 | 2 | 2 | 2 |
| Silane coupling agent | | 1 | 1 | 1 | 1 |
| ¹H-NMR proton peak ratio | | 1.85 | 1.85 | 1.85 | 1.70 |

TABLE 1

| Ingredients (parts by weight) | Example | | | | | | | | | |
|---|---|---|---|---|---|---|---|---|---|---|
| | 1 | 2 | 3 | 4 | 5 | 6 | 7 | 8 | 9 | 10 |
| Epoxy resin (a) | 52.7 | 52.7 | 52.7 | 52.7 | 52.7 | — | — | — | — | — |
| Epoxy resin (b) | — | — | — | — | — | 52.1 | — | — | — | — |
| Epoxy resin (c) | — | — | — | — | — | — | 66.7 | 66.7 | 66.7 | — |
| Epoxy resin (d) | — | — | — | — | — | — | — | — | — | 70.1 |
| Curing agent (e) | 34.8 | 34.8 | 34.8 | 34.8 | 34.8 | — | 33.3 | 33.3 | 33.3 | — |
| Curing agent (f) | — | — | — | — | — | 47.9 | — | — | — | 29.9 |
| Epoxy-modified silicone resin | 12.5 | 12.5 | 12.5 | 12.5 | 12.5 | — | — | — | — | — |
| Inorganic filler | | | | | | | | | | |
| Spherical silica | 500 | 500 | 500 | 500 | — | 850 | 500 | 500 | 500 | 500 |
| Crystalline silica | — | — | — | — | 500 | — | — | — | — | — |
| Curing accelerator | 1.2 | 1.2 | 1.2 | 1.2 | 1.2 | 1.2 | 1.2 | 1.2 | 1.2 | 1.2 |
| KEMGARD 1261 | — | 100 | — | 100 | — | — | — | — | 100 | — |
| KEMGARD 911C | 3 | — | 3 | — | 3 | 3 | 10 | 10 | — | 10 |
| Nova-Excel 140 | 0.5 | 0.5 | 2 | 2 | 1.5 | 0.5 | 1 | 3 | 3 | 1 |
| Antimony trioxide | — | — | — | — | — | — | — | — | — | — |
| Brominated novolak epoxy resin | — | — | — | — | — | — | — | — | — | — |
| Parting agent | 3 | 3 | 3 | 3 | 3 | 3 | 3 | 3 | 3 | 3 |
| Carbon black | 2 | 2 | 2 | 2 | 2 | 2 | 2 | 2 | 2 | 2 |
| Silane coupling agent | 1 | 1 | 1 | 1 | 1 | 1 | 1 | 1 | 1 | 1 |
| ¹H-NMR proton peak ratio | 1.85 | 1.85 | 1.85 | 1.85 | 1.85 | 1.90 | 2.32 | 2.32 | 2.32 | 2.05 |

TABLE 3

| | Example | | | | | | | | | |
|---|---|---|---|---|---|---|---|---|---|---|
| | 1 | 2 | 3 | 4 | 5 | 6 | 7 | 8 | 9 | 10 |
| Spiral flow (cm) | 95 | 70 | 92 | 70 | 50 | 135 | 85 | 80 | 65 | 90 |
| Hardness when molded | 85 | 75 | 78 | 70 | 86 | 75 | 85 | 81 | 70 | 65 |
| Moldability | OK | OK | OK | OK | OK | OK | OK | OK | OK | OK |
| Flame retardance | V-0 | V-0 | V-0 | V-0 | V-0 | V-0 | V-0 | V-0 | V-0 | V-0 |
| Moisture resistance | 0/20 | 0/20 | 0/20 | 0/20 | 0/20 | 0/20 | 0/20 | 0/20 | 0/20 | 0/20 |

TABLE 4

| | Comparative Example | | | |
|---|---|---|---|---|
| | 1 | 2 | 3 | 4 |
| Spiral flow (cm) | 95 | 95 | 70 | 90 |
| Hardness when molded | 85 | 82 | 75 | 85 |
| Moldability | OK | NG | NG | OK |
| Flame retardance | burned | V-0 | V-1 | V-0 |
| Moisture resistance | 0/20 | 20/20 | 0/20 | 0/20 |

From Tables 1 to 4, it is evident that the semiconductor encapsulating epoxy resin compositions of the invention are able to cure into products which have excellent flame retardance and moisture resistance. The resin compositions have no ill effects on human health and the environment because they contain no halogenated epoxy resins or antimony trioxide. Moreover, these epoxy resin compositions are effectively moldable. Semiconductor devices encapsulated with the epoxy resin compositions of the invention are fully flame retardant and highly reliable against moisture.

Japanese Patent Application No. 11-083656 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor encapsulating epoxy resin composition free from halogenated epoxy resins and antimony trioxide comprising
   (A) an epoxy resin,
   (B) a phenolic resin curing agent,
   (C) a microencapsulated flame retardant comprising a red phosphorus-base core coated with a thermoplastic resin or thermosetting resin or a mixture thereof,
   (D) a molybdenum compound, and
   (E) an inorganic filler.

2. The epoxy resin composition of claim 1 wherein the molybdenum compound (D) is zinc molybdate.

3. The epoxy resin composition of claim 2 wherein the molybdenum compound (D) is zinc molybdate supported on an inorganic carrier.

4. The epoxy resin composition of claim 3 wherein in the proton-NMR spectrum of (F) a mixture of the epoxy resin (A) and the phenolic resin curing agent (B), the value of (integrated value of proton peaks appearing at 1 to 5 ppm)/(integrated value of proton peaks appearing at 6 to 8 ppm) is less than 2.0, and 0.5 to 2 parts by weight of the microencapsulated flame retardant (C) and 3 to 100 parts by weight of the zinc molybdate on inorganic carrier (D) are present per 100 parts by weight of the mixture (F).

5. The epoxy resin composition of claim 3 wherein in the proton-NMR spectrum of (F) a mixture of the epoxy resin (A) and the phenolic resin curing agent (B), the value of (integrated value of proton peaks appearing at 1 to 5 ppm)/(integrated value of proton peaks appearing at 6 to 8 ppm) is at least 2.0, and 1 to 5 parts by weight of the microencapsulated flame retardant (C) and 10 to 100 parts by weight of the zinc molybdate on inorganic carrier (D) are present per 100 parts by weight of the mixture (F).

6. The epoxy resin composition of claim 3 wherein the zinc molybdate on inorganic carrier (D) has a zinc molybdate content of 5 to 40% by weight.

7. A semiconductor device encapsulated with a cured product of the epoxy resin composition of any one of claims 1 to 6.

8. The encapsulated semiconductor device of claim 7, produced by low-pressure transfer molding at a temperature of about 150 to 180° C. for a period of about 30 to 180 seconds.

9. The epoxy resin composition of claim 1, having a UL 94 flame retardance of V-0.

10. The epoxy resin composition of claim 1, wherein the coating resin is selected from the group consisting of poly(meth)acrylic acid esters, polystyrene, polybutadiene, methyl methacrylate-butadiene-styrene copolymers, silicone resins, epoxy resins, and phenolic resins.

* * * * *